United States Patent
Takagiwa

(10) Patent No.: US 8,391,072 B2
(45) Date of Patent: Mar. 5, 2013

(54) SEMICONDUCTOR MEMORY DEVICE AND METHOD FOR CONTROLLING THE SAME

(75) Inventor: Teruo Takagiwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/884,658

(22) Filed: Sep. 17, 2010

(65) Prior Publication Data

US 2011/0141817 A1 Jun. 16, 2011

(30) Foreign Application Priority Data

Dec. 11, 2009 (JP) ................. 2009-282107

(51) Int. Cl.
*G11C 11/34* (2006.01)
(52) U.S. Cl. .................. 365/185.22
(58) Field of Classification Search ............. 365/285.22
See application file for complete search history.

(56) References Cited

U.S. PATENT DOCUMENTS 7,212,464 B2 * 5/2007 Uehara et al. ............ 365/230.03

FOREIGN PATENT DOCUMENTS

| JP | 3935139 | 3/2007 |
| JP | 2007-102942 | 4/2007 |
| JP | 2008-4178 | 1/2008 |
| JP | 2009-87491 | 4/2009 |

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a semiconductor memory device includes a plurality of memory cells, and a plurality of latch circuits. The memory cells are associated with columns and are capable of storing data. The latch circuits are associated with the columns and are capable of storing write data and/or read data for the columns. The latch circuits are selectively activated, and activated latch circuits are capable of receiving and/or outputting data.

20 Claims, 14 Drawing Sheets

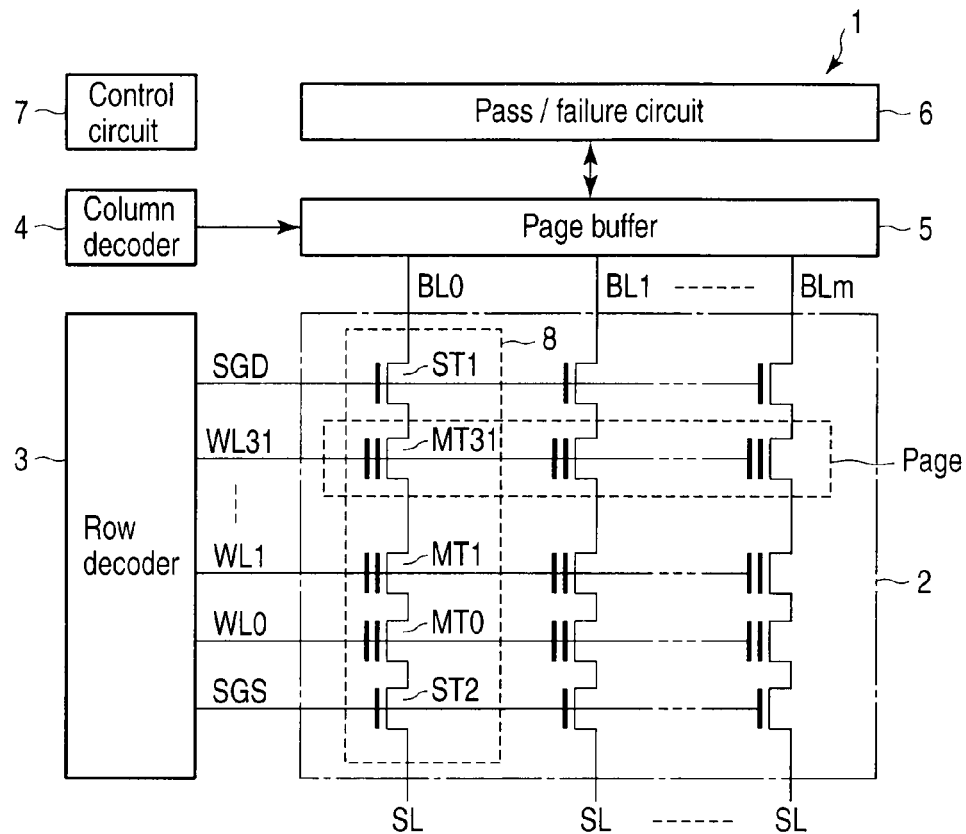
F I G. 1
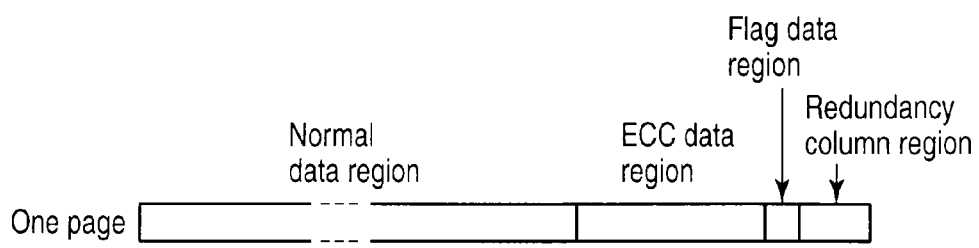
F I G. 2

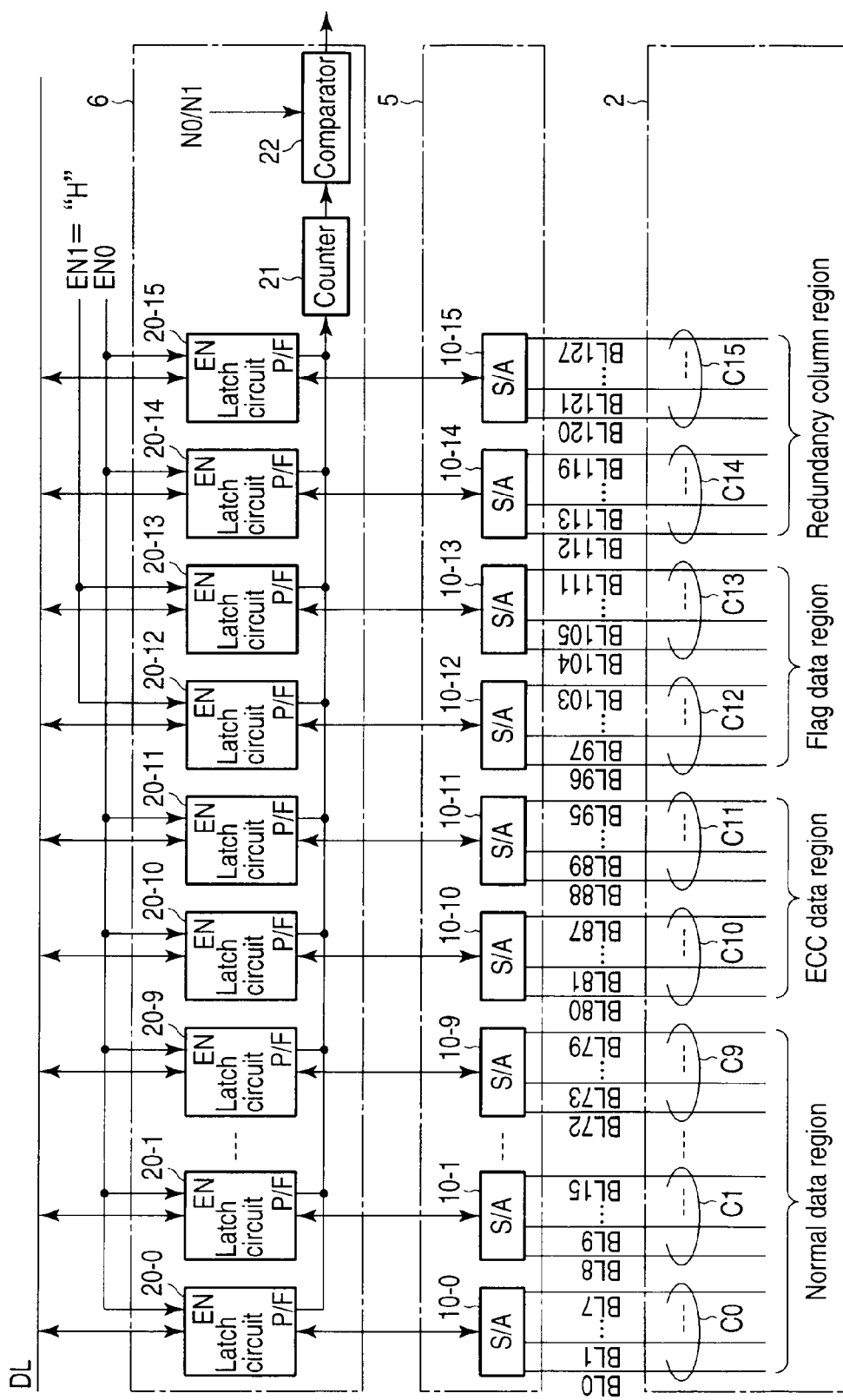
F I G. 4

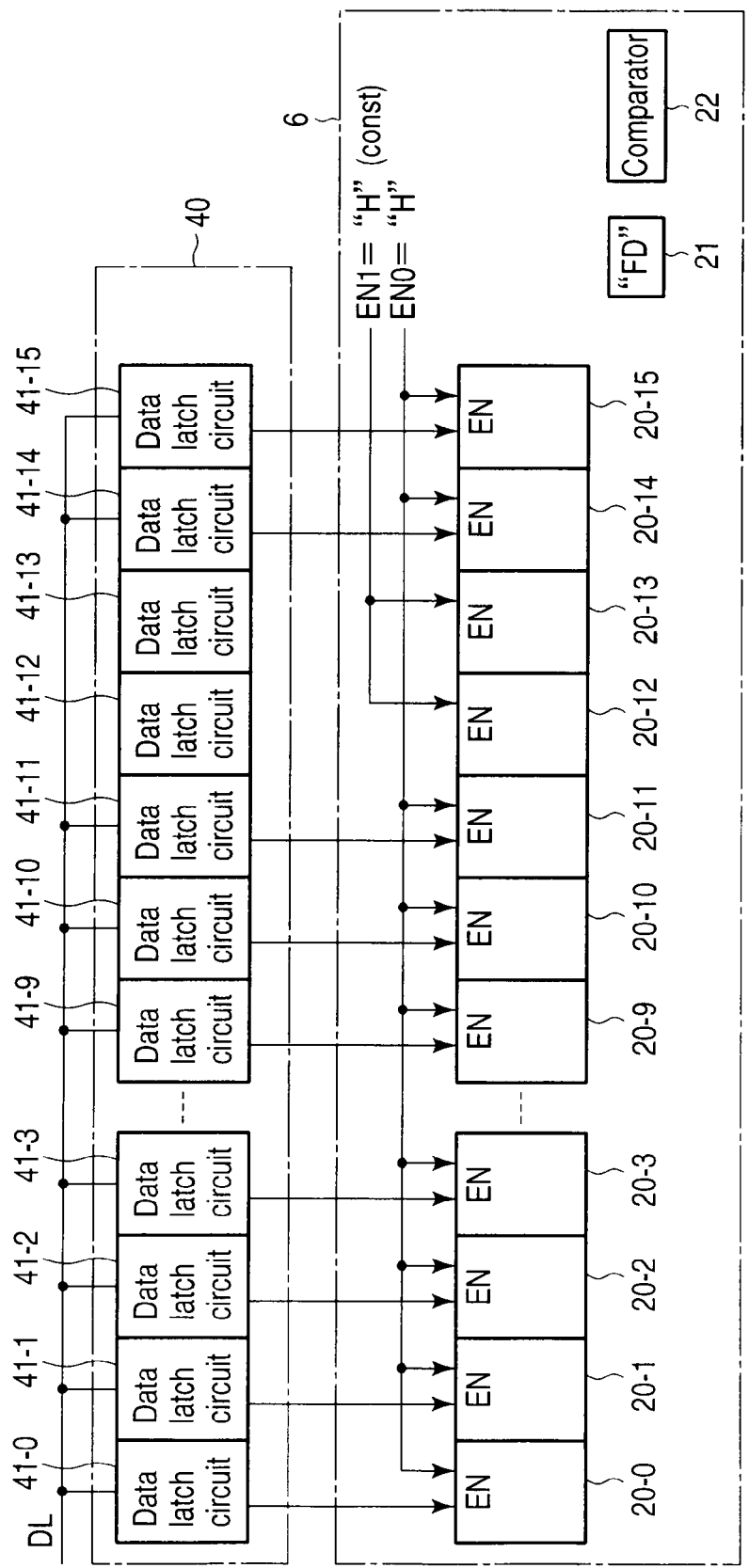
F I G. 16

SEMICONDUCTOR MEMORY DEVICE AND METHOD FOR CONTROLLING THE SAME

CROSS-REFERENCE TO RELATED APPLICATIONS

This application is based upon and claims the benefit of priority from Japanese Patent Application No. 2009-282107, filed Dec. 11, 2009; the entire contents of which are incorporated herein by reference.

FIELD

Embodiments described herein relate generally to a semiconductor memory device and a method for controlling the same. For example, the embodiments relate to a multi-level NAND flash memory.

BACKGROUND

Conventionally, there is well known a multi-level NAND flash memory in which each memory cell can retain data having at least two bits. It is also well known that flag data indicating the number of bits of the data each memory cell stores (for example, whether the memory cell stores one bit data or two bit or more data) is used in the multi-level NAND flash memory. For example, Japanese Patent No. 3935139 discloses the technique of the multi-level NAND flash memory. During data read, a proper read operation can be performed by previously confirming the flag data. In the NAND flash memory, an error correction circuit (ECC circuit) is usually provided on the assumption that a defective bit exists. For example, Jpn. Pat. Appln. KOKAI Publication No. 2009-087491 discloses the ECC circuit. The maximum number of defective bits permitted in each one page is previously determined.

However, when the defective bits are intensively generated in a region where the flag data is stored, the correct read is hardly performed.

BRIEF DESCRIPTION OF THE DRAWINGS

FIG. 1 is a block diagram of a flash memory according to a first embodiment;

FIG. 2 is a conceptual view of a data region according to the first embodiment;

FIG. 4 is a block diagram of a page buffer and a pass/failure circuit according to the first embodiment;

FIGS. 16 and 17 are block diagrams of the pass/failure circuit and the data buffer according to the third embodiment.

DETAILED DESCRIPTION

Figure 3:
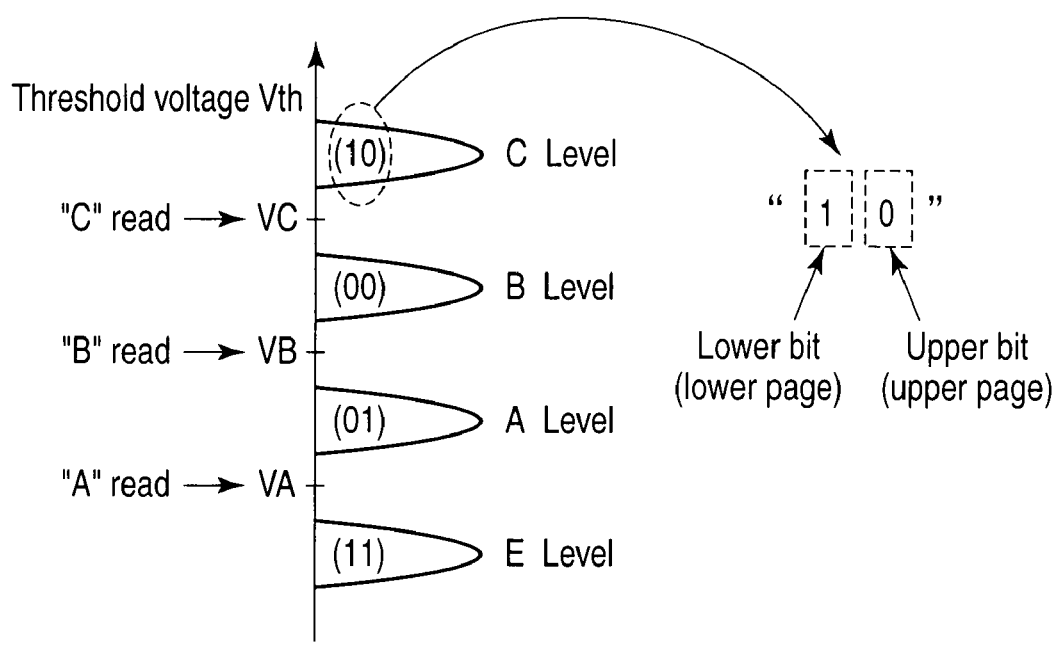
FIG. 3 is a graph illustrating a threshold distribution of a memory cell according to the first embodiment.

In general, according to one embodiment, a semiconductor memory device includes: a plurality of memory cells; and a plurality of latch circuits. The memory cells are associated with columns and are capable of storing data. The latch circuits are associated with the columns and are capable of storing write data and/or read data for the columns. The latch circuits are selectively activated, and activated latch circuits are capable of receiving and/or outputting data.

[First Embodiment]

A semiconductor memory device according to a first embodiment will be described by taking the multi-level NAND flash memory as an example.

<Entire Configuration of NAND Flash Memory>

FIG. 1 is a block diagram of a four-level NAND flash memory according to the first embodiment. Referring to FIG. 1, a NAND flash memory 1 includes a memory cell array 2, a row decoder 3, a column decoder 4, a page buffer 5, a pass/failure circuit 6, and a control circuit 7.

As illustrated in FIG. 1, the memory cell array 2 includes a plurality of NAND cells 8. For example, each of the NAND cells 8 includes 32 memory cell transistors MT0 to MT31 and selection transistors ST1 and ST2. Hereinafter the memory cell transistors MT0 to MT31 are collectively referred to as memory cell transistor MT when not distinguished from one another. The memory cell transistor MT has a stacked gate structure including a charge accumulation layer (for example, floating gate) formed on a semiconductor substrate with a gate insulator interposed therebetween and a control gate formed on the charge accumulation layer with an inter-gate insulator interposed therebetween. The number of memory cell transistors MT is not limited to 32, but 16, 64, 128, or 256 memory cell transistors MT may be used. The charge accumulation layer may be made of an insulating material. A source and a drain are shared by the memory cell transistors MT adjacent to each other. The memory cell transistors MT are disposed between the selection transistors ST1 and ST2 such that current passes of the memory cell transistors MT are connected in series. A drain on one end side of the series-connected memory cell transistors MT is connected to the source of the selection transistor ST1, and a source on the other end is connected to the drain of the selection transistor ST2.

The control gates of the memory cell transistors MT located in the same row are commonly connected to one of word lines WL0 to WL31, and the gates of the selection transistors ST1 and ST2 located in the same row are commonly connected to selection gate lines SGD and SGS, respectively. Hereinafter the word lines WL0 to WL31 are simply referred to as word line WL when not distinguished from one another. The drain of the selection transistor ST1 is connected to one of bit lines BL0 to BLm (m is a natural number of 2 or more), and the sources of the selection transistors ST2 are commonly connected to a source line SL. Hereinafter the bit lines BL0 to BLm are simply referred to as bit line BL when not distinguished from one another.

In the above configuration, a unit called a block is formed by the NAND cells 8 by which the word line WL and the selection gate lines SGD and SGS are shared. Data is collectively erased in the memory cell transistors MT in the same block. The data is collectively written in the memory cell transistors MT connected to the same word line WL, and the unit is called a page. Although only one block is illustrated in FIG. 1, the plurality of blocks may be provided in a direction along the bit line BL. In such cases, the NAND cells 8 located in the same column in the memory cell array 2 are commonly connected to the same bit line BL.

A method for storing the data in the memory cell array 2 will be described below with reference to FIG. 2. FIG. 2 is a schematic diagram illustrating a data region for one word line WL. As illustrated in FIG. 2, the data region includes a normal data region, an ECC data region, a flag data region, and a redundancy column region.

The normal data region and the ECC data region retain the data transferred to the NAND flash memory 1 from a host device (such as a personal computer and a digital camera) that controls the NAND flash memory 1. The normal data region retains net data input by a user. The ECC data region retains ECC data (such as parity) used in ECC correction of the data stored in the normal data region. The flag data region retains flag data. The flag data is also called an LM flag, and is information as to whether the data stored in the memory cell connected to corresponding word line WL is one-bit data or two-bit data. For example, the flag data is produced in the NAND flash memory 1. The detailed flag data is described later. The redundancy column region is a region to which the defective memory cell transistor MT is replaced. The data to be replaced includes not only the data in the normal data region but also the data in the ECC data region or the flag data region. It can be said that the normal data region is a region except the ECC data region, the flag data region, and the redundancy column region.

The data that can be taken by the memory cell transistor MT will be described below. For example, the memory cell transistor MT is configured to retain one-bit data or two-bit data according to a threshold voltage. FIG. 3 is a graph illustrating a threshold distribution of the memory cell transistor MT. In FIG. 3, a vertical axis indicates a threshold voltage Vth, and a horizontal axis indicates existence probability of the memory cell transistor MT.

As illustrated in FIG. 3, each memory cell transistor MT can retain four-level (two-bit) data. More specifically, the memory cell transistor MT can retain four kinds of pieces of data, that is, an "E" level, an "A" level, a "B" level, and a "C" level in ascending order of the threshold voltage Vth.

The "E" level is an erasing level whose threshold voltage VthE is in the range of VthE<VA. A threshold voltage VthA of the "A" level is in the range of VA<VthA<VB. A threshold voltage VthB of the "B" level is in a range of VB<VthB<VC. A threshold voltage VthC of the "C" level is in a range of VC<VthC.

The "E" level, "A" level, "B" level, and "C" level are correlated with "11" data, "01" data, "00" data, and "10" data in binary indication, respectively. The bits of the two-bit data are called an upper bit (or upper data) and a lower bit (or lower data) as illustrated in FIG. 3. The relationship between the "E" level to the "C" level and the "00" data to "11" data is not limited to the case illustrated in FIG. 3, but can appropriately be selected.

As described above, the data is collectively written or read in and from the memory cell transistors MT connected to the same word line WL. At this point, the data is written or read in each lower bit or upper bit. Accordingly, when the memory cell transistor MT retains the two-bit data, two pages are allocated to each word line WL. The lower page is one in which the lower bits of data are collectively written or read, and the upper page is one in which the upper bits of data are collectively written or read.

As is clear from FIG. 3, when only the lower page data is written into the memory cell transistor MT, the memory cell transistor MT can take only two states, that is, the state having the threshold corresponding to the "E" level and the state having the threshold corresponding to the "A" level or more. On the other hand, when both the lower page and upper page data is written into the memory cell transistor MT, the memory cell transistor MT can take four states of the "E", "A", "B", and "C" levels.

The flag data indicates whether the associated memory cell transistor MT is in the state in which only the lower page data is written (that is, the state in which the memory cell transistor MT retains only the data with one of the "E" level and the "A" level or more) or the state in which both the lower page data and the upper page data is written (that is, the state in which the memory cell transistor MT can also take the "A" level, "B" level, and "C" level). In other words, the flag data is data that indicates an amount of information stored in the memory cell transistor MT. By way of example, the flag data of the first embodiment is written using the two levels of the "E" level and the "A" level, while the "B" level and the "C" level are not used. That is, the flag data is written using only the lower page.

The data read performed with the voltage VC as the read level (that is, a determination whether the threshold level is the "C" level or the "B" level) is called "C"-read. The data read performed with the voltage VB as the read level (that is, a determination whether the threshold level is the "B" level or more or the "A" level or less) is called "B"-read. The data read performed with the voltage VA as the read level (that is, a determination whether the threshold level is the "A" level or more or the "E" level or less) is called "A"-read.

Referring to FIG. 1, the description is continued. The row decoder 3 selects a row direction of the memory cell array 2. That is, the row decoder 3 selects the word line WL. The row decoder 3 applies a proper voltage to the selected word line WL and the non-selected word line WL.

During the data write, the page buffer 5 temporarily retains the externally provided write data and transfers the write data to the bit line BL, thereby collectively writing the data in units of page. During the data read, the page buffer 5 senses and amplifies the data read on the bit line BL in units of pages, and temporarily retains the data and outputs the data to the outside.

The column decoder 4 selects a column direction of the memory cell array 2. That is, the column decoder 4 selects the bit line BL. For example, during the data read, the column decoder 4 provides a command to the page buffer 5 to output the data associated with the selected bit line BL.

For example, during a verification operation, the pass/failure circuit 6 retains information as to whether each column of the memory cell array 2 passes or fails in verification. The pass/failure circuit 6 counts a failure number (e.g. the number of failed bits or the number of failed columns) to compare the failure number with the predetermined permissible number of defects.

The control circuit 7 controls the whole operation of the NAND flash memory 1. That is, the control circuit 7 controls the operations of the row decoder 3, column decoder 4, page buffer 5, and pass/failure circuit 6 during write, read, and erase of data.

<Details of Page Buffer, Pass/Failure Circuit, and Memory Cell Array>

The page buffer 5, the pass/failure circuit 6, and the memory cell array 2 will be described in detail with reference to FIG. 4. FIG. 4 is a block diagram illustrating the page buffer 5, the pass/failure circuit 6, and the memory cell array 2.

First the memory cell array 2 will be described. The memory cell array 2 includes 128 (m=127) bit lines BL. For the sake of convenience, the number of bit lines BL is set to 128. Obviously the number of bit lines BL is not limited to 128, but an actual product usually includes 128 or more bit lines BL. The eight adjacent bit lines BL from the bit line BL0 form a unit of one column. In the first embodiment, because 128 bit lines BL are included, 16 columns C0 to C15 are included. The bit lines BL8i to BL(8i+7) belong to the column Ci (i is an integer of 0 to 15). Hereinafter the columns C0 to C15 are simply referred to as column C when not distinguished from one another.

In the 16 columns C, the columns C0 to C9 are in the normal data region, the columns C10 and C11 are in the ECC data region, the columns C12 and C13 are in the flag data region, and the columns C14 and C15 are in the redundancy column region.

Then the page buffer 5 will be described. The page buffer 5 includes a plurality of sense amplifiers 10-0 to 10-15 that are associated with the columns C0 to C15, respectively. Hereinafter occasionally the sense amplifiers 10-0 to 10-15 are collectively referred to as sense amplifier 10 when not distinguished from one another.

The sense amplifier 10-i is associated with the column Ci, that is, the bit lines BL8i to BL(8i+7) and has a function of retaining the data (therefore, also referred to as latch circuit 10). During the data read, the sense amplifier 10-i senses and amplifies the data read on the bit lines BL8i to BL(8i+7), and temporarily retains the data. The sense amplifier 10-i outputs the read data to the pass/failure circuit 6. On the other hand, during the data write, the sense amplifier 10-i temporarily retains program data provided from the pass/failure circuit 6, and transfers the program data to the bit lines BL8i to BL(8i+7). During the verification, the sense amplifier 10-i temporarily retains information as to whether each of the bit lines BL8i to BL(8i+7) passes in the verification, and transfers the information to the pass/failure circuit 6.

Then the pass/failure circuit 6 will be described. Similarly to the page buffer 5, the pass/failure circuit 6 includes a plurality of latch circuits 20-0 to 20-15 that are associated with the columns C0 to C15, respectively, a counter 21, and a comparator 22. Hereinafter occasionally the latch circuits 20-0 to 20-15 are collectively referred to as latch circuit 20 when not distinguished from one another.

The latch circuit 20-i is associated with the sense amplifier 10-i. That is, the latch circuits 20-0 to 20-15 are associated with the sense amplifiers 10-0 to 10-15, respectively. During the data read, the latch circuit 20-i temporarily retains eight-bit read data transferred from the sense amplifier 10-i. One of the latch circuits 20-i, selected by the column decoder 4, outputs the read data to the host device through the data line DL.

During the data write, the latch circuit 20-i selected by the column decoder 4 retains the eight-bit program data, which is input from the host device through the data line DL or provided from the control circuit 7. The latch circuit 20-i transfers the program data to the associated sense amplifier 10-i. The latch circuit 20-i retains pass/failure information (specifically, for example failure number), which is obtained as a result of the verification in the sense amplifier 10-i. The latch circuit 20-i outputs the failure number to the counter 21 based on an enable signal EN. For example, the control circuit 7 outputs a signal EN1 as the enable signal EN to the latch circuits 20-12 and 20-13 associated with the columns C12 and C13 that are the flag data region, and the control circuit 7 outputs an signal EN0 as the enable signal EN to the latch circuits 20-0 to 20-11, 20-14, and 20-15 associated with the columns C0 to C11, C14, and C15. The latch circuit 20 in which the enable signal EN is set to "H" outputs the failure number to the counter 21. During the failure number transfer, the signal EN1 is always set to "H" level, and the signal N0 is controlled in the "H" or "L" level by the control circuit 7. This point is described in detail later.

The failure information transferred from the sense amplifier 10-i to the latch circuit 20-i may be a total failure number existing in the associated eight bit lines BL8i to BL(8i+7) or information in which the failure number is set to "1" when the failure exists in one of the bit lines BL8i to BL(8i+7). The latter will be described by way of example. That is, when, the verification for at least one bit line is failed in one of the columns, the failure number is set to "1" in the associated latch circuit 20.

The counter 21 counts the failure number output from the latch circuit 20 and outputs the counting result to the comparator 22.

The comparator 22 compares the counting result provided from the counter 21 with a reference value provided from, for example, the control circuit 7. The reference value is the maximum failure number (the allowable number of defects) that is allowable in the columns C0 to C15, a reference value N0 is provided in the case of the signal EN0="H", and a reference value N1 (<N0) is provided in the case of the signal EN0="L". The comparator 22 outputs the comparison result to the control circuit 7.

In the first embodiment, one column includes the eight bit lines. The number of bit lines is not limited to eight. The correlation between each column C and each bit line BL is not limited to the case of FIG. 4, but can appropriately be selected.

<Data Read Operation>

Figure 5:
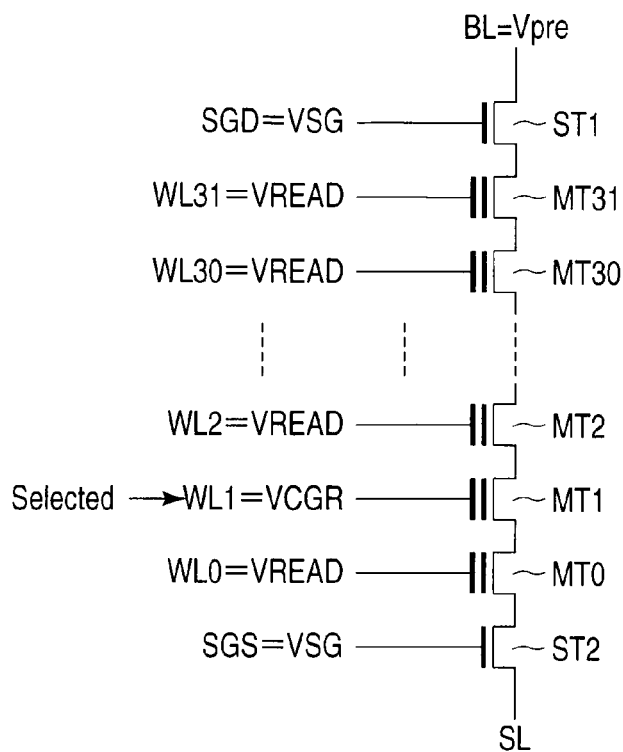
FIG. 5 is a circuit diagram of a NAND cell according to the first embodiment.

A data read operation in the NAND flash memory 1 having the above-described configuration will be described below. FIG. 5 is a circuit diagram of the NAND cell 8 during the data read. The data read from the memory cell transistor MT1 connected to the word line WL1 will be described by way of example.

The sense amplifier 10 precharges the bit line BL of the associated column C to set a potential at the bit line BL to Vpre (for example, 0.7 V). For example, the voltage at the source line SL is set to 0 V.

The row decoder 3 selects the word line WL1 and applies a read voltage VCGR to the selected word line WL1. The read voltage VCGR is one of VA, VB, and VC illustrated in FIG. 3, and is changed according to the read of one of the "A" to "C" levels. The row decoder 3 applies a voltage VREAD to the non-selected word lines WL0 and WL2 to WL31. The voltage VREAD is one that sets the memory cell transistor MT to the on-state irrespective of the retained data. The row decoder 3 also applies a voltage VSG to the selection gate lines SGD and SGS. The voltage VSG is one that sets the selection transistors ST1 and ST2 to the on-states.

As a result, the memory cell transistors MT0 and MT2 to MT31 connected to the non-selected word lines WL0 and WL2 to WL31 become the on-states to form a channel. The selection transistors ST1 and ST2 are also set to the on-states.

When the memory cell transistor MT connected to the selected word line WL1 becomes the on-state, an electric conduction state is established between the bit line BL and the source line SL. That is, a current is passed from the bit line BL to the source line SL. On the other hand, when the memory cell transistor MT connected to the selected word line WL1 becomes the off-state, an electric non-conduction state is established between the bit line BL and the source line SL. That is, a current is not passed from the bit line BL to the source line SL. The data is collectively read from all the bit lines through the operation.

The sense amplifier 10 senses the current passed through the bit line BL, and determines the data based on whether the current amount exceeds a threshold Ith.

During the data read, the control circuit 7 changes a read sequence according to the flag data read from the columns C12 and C13. For example, the memory cell transistor MT connected to the associated word line retains the two-bit data when "1" is written as the flag data in the columns C12 and C13, and retains the one-bit data when "0" is written in the columns C12 and C13 (in other words, when the flag data is not written).

Therefore, when the flag data is not written, the control circuit 7 reads the lower-bit data while not reading the upper-bit data. On the other hand, when the flag data is written, the control circuit 7 reads not only the lower-bit data but also the upper-bit data.

<Data Write Operation>

Figure 6:
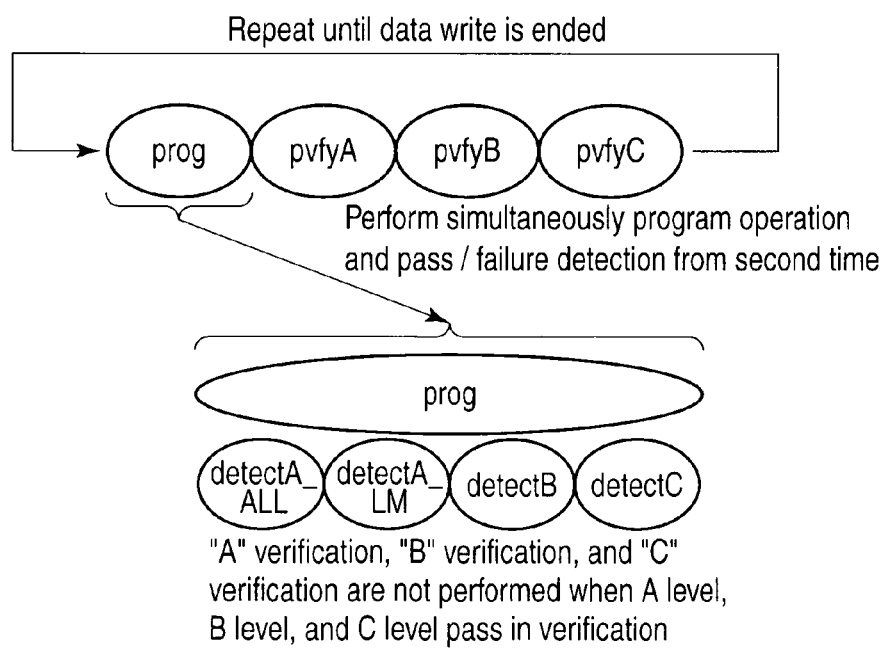
FIG. 6 is a state transition diagram during data write according to the first embodiment.

Then the data write operation will be described. First a rough flow of the data write operation will be described with reference to FIG. 6. FIG. 6 is a state transition diagram illustrating the data write operation.

As illustrated in FIG. 6, a program operation (designated by "prog" in FIG. 6), a program verification operation (designated by "pvfyA", "pvfyB", and "pvfyC" in FIG. 6), and a pass/failure detection operation (designated by "detectA_ALL", "detectA_LM", "detectB", and "detectC" in FIG. 6) are repeated in the data write operation. In the program operation, the threshold of the memory cell transistor MT is increased by injecting charges in the charge accumulation layer of the memory cell transistor MT. As a result of the program operation, a confirmation whether the memory cell transistor MT has reached a desired threshold level is made in the program verification operation. The memory cell transistor MT passes in the program verification when reaching the desired threshold, and fails in the program verification when not reaching the desired threshold. As a result of the program verification operation, a confirmation whether the failure number is equal to or lower than the predetermined allowable number of defects is made in the pass/failure detection operation. The program verification operation can be performed in parallel with the program operation repeated next.

The program operation, the program verification operation, and the pass/failure detection operation will be described in detail.

<Program Operation>

Figure 7:
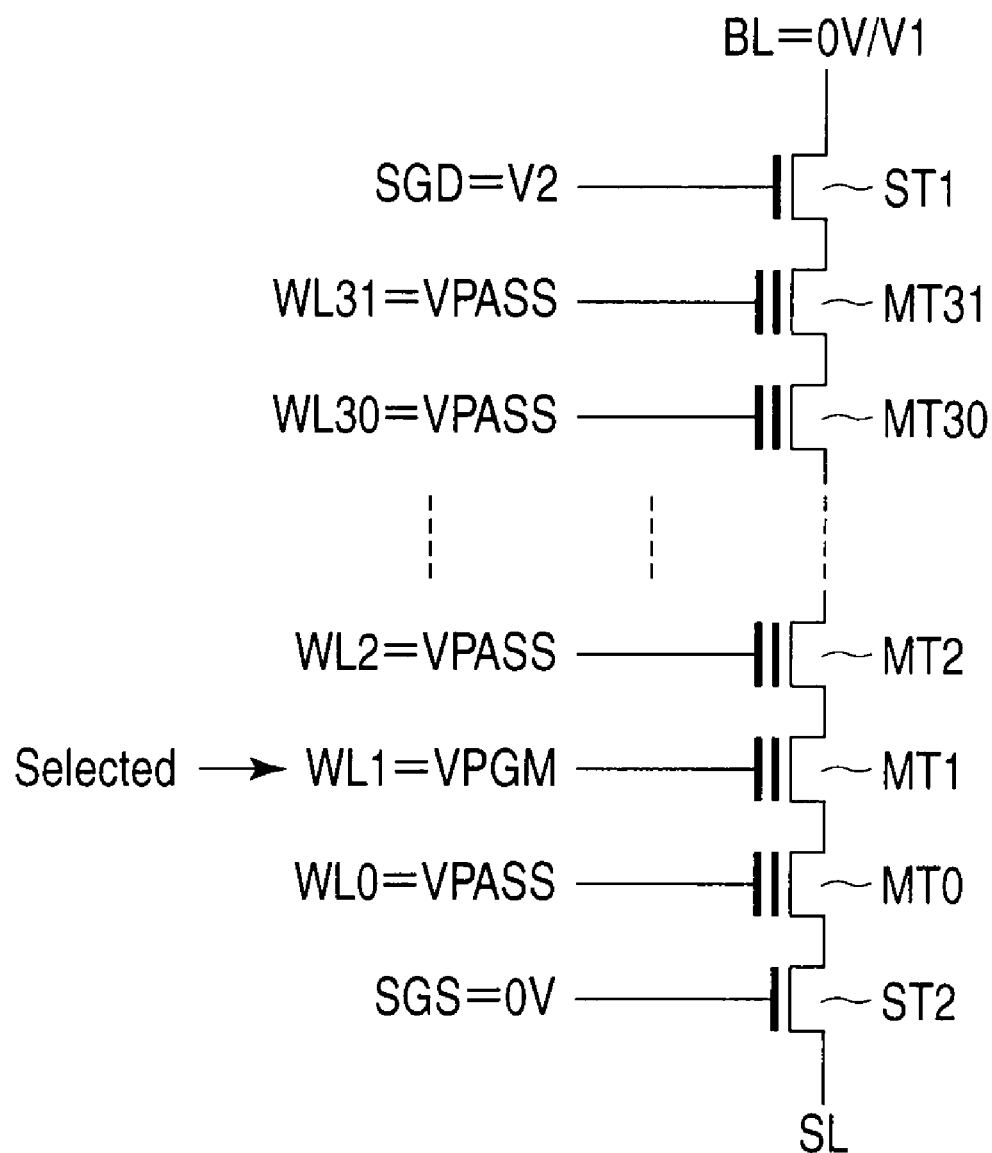
FIG. 7 is a circuit diagram of the NAND cell according to the first embodiment.

FIG. 7 is a circuit diagram of the NAND cell 8 during the program operation. The case where the data is programmed in the memory cell transistor MT1 connected to the word line WL1 will be described below by way of example.

The program data is stored in the latch circuit 20 from the host device through the data line DL. The program data produced in the NAND flash memory 1, for example, the flag data produced by the control circuit 7 is stored as the program data in the latch circuits 20-12 and 20-13. Then the program data stored in the latch circuit 20 is transferred to the sense amplifier 10.

The sense amplifier 10 transfers the program data to the bit line BL of the associated column C. More specifically, a write voltage (for example, 0 V) is applied to the bit line BL when the threshold of the memory cell transistor MT is raised by injecting charges in the charge accumulation layer. On the other hand, a write inhibition voltage (for example, V1>0 V) is applied when the charges are not injected.

The row decoder 3 selects the word line WL1, the voltage VPGM is applied to the selected word line WL1, and the voltage VPASS is applied to the non-selected word lines WL0 and WL2 to WL31. The voltage VPGM is a high voltage (for example, about 20 V) used to inject the charges in the charge accumulation layer, and the voltage VPASS is a voltage that sets the memory cell transistor MT to the on-state irrespective of the retained data.

The row decoder 3 applies voltages V2 and 0 V to the selection gate lines SGD and SGS, respectively. The voltage V2 sets the selection transistor ST1 to the on-state when the write voltage (0 V) is applied to the bit line BL, and cuts off the selection transistor ST1 when the write inhibition voltage (V1) is applied to the bit line BL.

As a result, the channel is formed in all the memory cell transistors MT0 to MT31 connected to the word lines WL0 to WL31. When the write voltage (0 V) is applied to the bit line BL, the selection transistor ST1 becomes the on-state, and the write voltage is transferred to the channel of the memory cell transistor MT1. As a result, a large potential difference is generated between the control gate and the channel in the memory cell transistor MT1 to inject the charges in the charge accumulation layer. On the other hand, when the write inhibition voltage V1 is applied to the bit line, the selection transistor ST1 becomes the off-state, and the channel of the memory cell transistor MT1 becomes an electrically floating state. The potential at the memory cell transistor MT1 is raised to about the voltage VPGM by coupling to the control gate. As a result, the potential difference between the control gate and the channel is decreased to suppress the injection of the charges in the charge accumulation layer.

<Program Verification Operation>

The program verification operation is performed after the program operation. As illustrated in FIG. 6, the program verification operation includes "A"-verification ("pvfyA" in FIG. 6), "B"-verification ("pvfyB" in FIG. 6), and "C"-verification ("pvfyC" in FIG. 6) which are sequentially performed.

"A"-verification is program verification in which the read level VA is used. That is, in FIG. 5, the data is read by applying the voltage VA to the word line WL selected during the program operation (VCGR=VA). For example, the column in which the "01" data should be programmed is determined to fail in the verification when the memory cell transistor MT is turned on, and the column is determined to pass in the verification when the memory cell transistor MT is turned off. For the column that has passed in the verification, the bit line BL is fixed to a certain positive potential, and the program is not executed.

Similarly, the "B"-verification is program verification in which the read level VB is used, and the "C"-verification is program verification in which the read level VC is used. In FIG. 5, the voltages VB and VC are applied to the selected word line WL (VCGR=VB and VC) to read the data.

The latch circuit of the sense amplifier 10 retains the pass/failure information in each bit line BL. For example, "1" is retained in the latch circuit when the associated bit line BL fails in the verification. After the program verification, each sense amplifier 10 transfers "1" to the associated latch circuit 20 when at least one of the eight bit lines BL fails in the verification.

As described above, the data transferred to the latch circuit 20 is not limited to "1". For example, the total failure number existing on the associated eight bit lines BL may be transferred to the latch circuit 20. That is, when the four of the eight bit lines BL fail in the verification, the sense amplifier 10 may transfer "4" to the associated latch circuit 20. However, the case where "1" is transferred when one of the bit lines BL fails in the verification will be described below by way of example.

<Pass/Failure Detection Operation>

Then the pass/failure detection operation will be described. As described above, as a result of the program verification operation, a determination whether the failure number (the number of fail columns or the total number of fail bits) is equal to or lower than the allowable number of defects is made in the pass/failure detection operation.

As illustrated in FIG. 6, the pass/failure detection operation includes "A"-failure detection ("detectA_ALL" in FIG. 6), flag-failure detection ("detectA_LM" in FIG. 6), "B"-failure detection ("detectB" in FIG. 6), and "C"-failure detection ("detectC" in FIG. 6), which are sequentially performed.

The "A"-failure detection, the "B"-failure detection, and the "C"-failure detection are operations that determine whether the failure numbers obtained as a result of the "A"-verification, "B"-verification, and "C"-verification are equal to or lower than the allowable numbers of defects, respectively.

The flag-failure detection is the operation in which the "A"-failure detection is performed only to the columns C12 and C13 that retains the flag data. At this point, the failure existing in the columns C0 to C11, C14, and C15 are not taken into account.

In both the "A"-failure detection and the flag-failure detection, when the failure number becomes the allowable defects or less, the "A"-verification is omitted in next pass/failure detection operation. Similarly, when the failure number in the "B"-failure detection becomes the allowable number of defects or less, the "B"-verification is omitted in next pass/failure detection operation. When the failure number in the "C"-failure detection becomes the allowable number of defects or less, the data write operation is completed.

<<Details of Pass/Failure Detection Operation>>

The pass/failure detection operation will be described in detail below.

"A"-Failure Detection, "B"-Failure Detection, and "C"-Failure Detection

Figure 8:
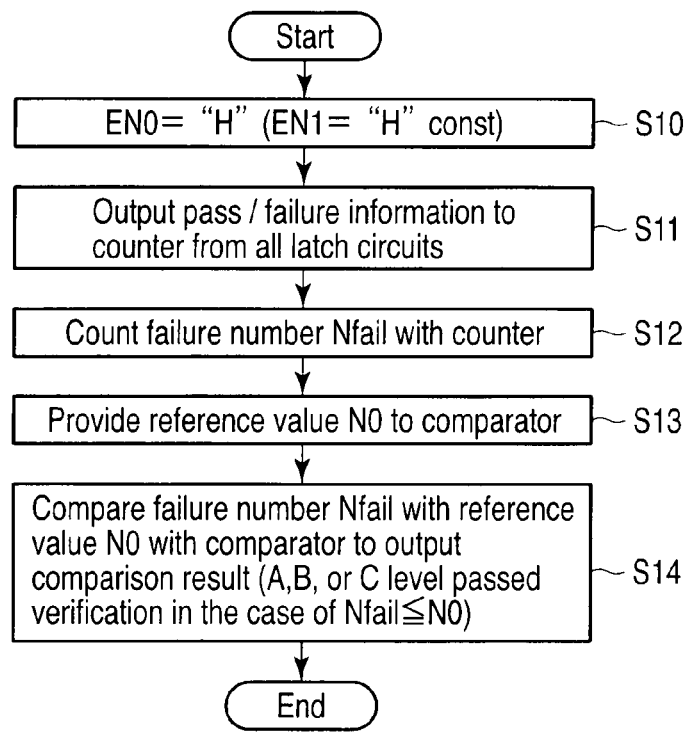
FIGS. 8 and 9 are flowcharts illustrating an operation of a flash memory according to the first embodiment.

The "A"-failure detection, the "B"-failure detection, and the "C"-failure detection will be described with reference to FIGS. 4 and 8. FIG. 8 is a flowchart illustrating a flow of the "A"-failure detection, "B"-failure detection, and "C"-failure detection.

As illustrated in FIG. 8, the control circuit 7 sets the signal EN0 to "H" level (Step S10). The signal EN1 is always set to the "H" level at least in a period of the pass/failure detection operation. As a result, all the latch circuits 20-0 to 20-15 output the pass/failure information (failure numbers in the first embodiment) to the counter 21 (Step S11). The counter 21 counts the failure numbers transferred from the latch circuits 20-0 to 20-15 (Step S12). The counting result of the counter is called failure number Nfail. The failure number Nfail is provided to the comparator 22.

The control circuit 7 provides a reference value N0 to the comparator 22. The comparator 22 compares the failure number Nfail provided from the counter 21 with the reference value N0 provided from the control circuit 7 and outputs the comparison result to the control circuit 7 (Step S14).

As a result of the comparison, when the failure number Nfail is equal to or lower than the reference value N0 (Nfail≦N0), the detection operation passes in the verification. For example, when Nfail≦N0 is obtained for the "B"-failure detection, the "B"-verification is omitted after that.

When the Nfail≦N0 is obtained for the "C"-failure detection, the data write operation is completed. Even if Nfail≦N0 is obtained for the "A"-failure detection, however, the "A"-verification is repeated until the flag-failure detection passes in the verification.

Flag-Failure Detection

Figure 9:
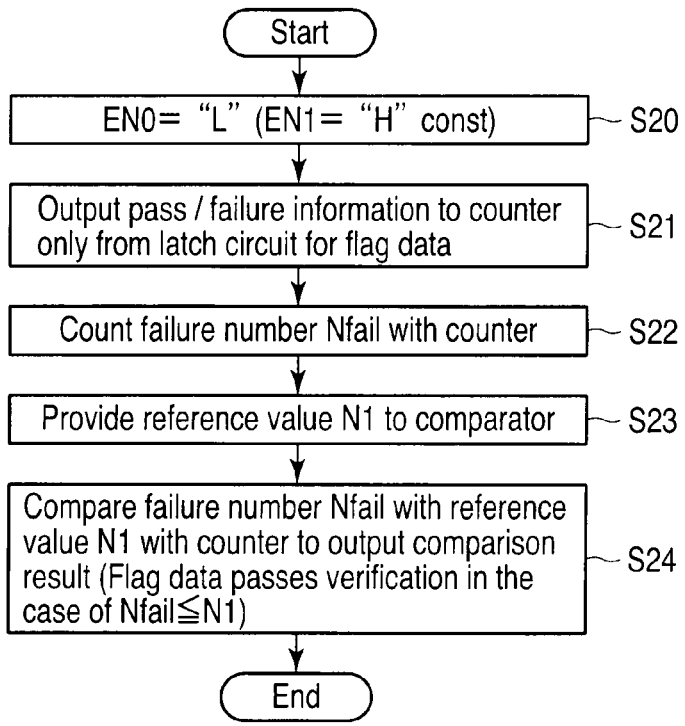

Then the flag-failure detection will be described with reference to FIG. 9. FIG. 9 is a flowchart illustrating a flow of the flag-failure detection operation.

As illustrated in FIG. 9, the control circuit 7 sets the signal EN0 to the "L" level (Step S20). As described above, the signal EN1 is set to the "H" level. As a result, only the enable signals EN of the latch circuits 20-12 and 20-13 are set to the "H" level to output the pass/failure information to the counter 21 (Step S21). The latch circuits 20-0 to 20-11, 20-14, and 20-15 whose enable signals EN are set to the "L" level do not output the pass/failure information.

The counter 21 counts the failure numbers transferred from the latch circuits 20-12 and 20-13 (Step S22). The counter 21 outputs the counting result (failure number Nfail) to the comparator 22.

The control circuit 7 provides a reference value N1 to the comparator 22. The comparator 22 compares the failure number Nfail provided from the counter 21 with the reference value N1 provided from the control circuit 7 and outputs the comparison result to the control circuit 7 (Step S24).

As a result of the comparison, when the failure number Nfail is equal to or lower than the reference value N1 (Nfail≦N1), the detection operation passes in the verification. Therefore, assuming that the program to the "A" level is completed, the "A"-verification is omitted after that.

<<Specific Example of Pass/Failure Detection Operation>>

Figure 10:
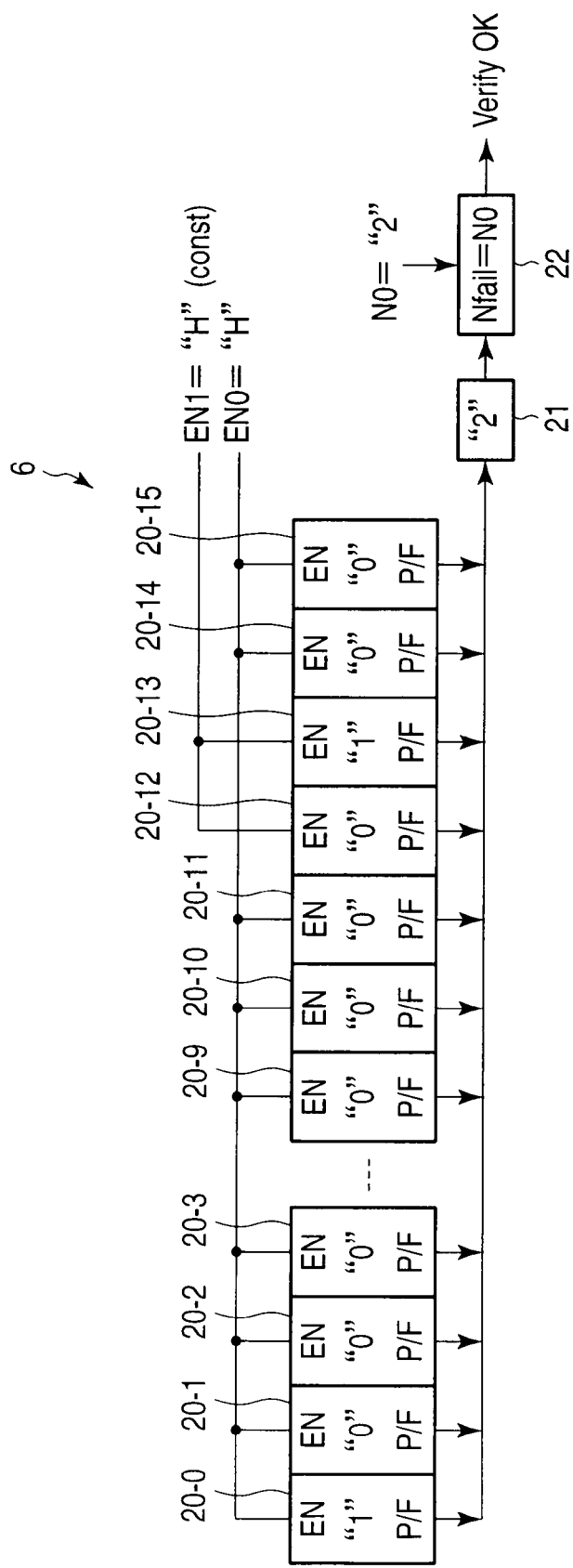
FIGS. 10 and 11 are block diagrams of the pass/failure circuit according to the first embodiment.

Then a specific example of the pass/failure detection operation will be described. The "A"-failure detection, the "B"-failure detection, and the "C"-failure detection will be described with reference to FIG. 10. FIG. 10 is a block diagram of the pass/failure circuit 6 during the pass/failure operation. The case where the reference value N0 is set to "2" while the failure exists in the columns C0 and C13 during the "A"-failure detection will be described by way of example.

As illustrated in FIG. 10, because the failure exists in the columns C0 and C13, "1" is retained in the latch circuits 20-0 and 20-13, and "0" is retained in the latch circuits 20-1 to 20-12, 20-14, and 20-15.

The control circuit 7 sets the signal EN0 to the "H" level and outputs the reference value N0="2" to the comparator 22. Therefore, in all the latch circuits 20, the enable signal EN is set to the "H" level, and the data ("0" or "1") retained in each latch circuit 20 to the counter 21. The counter 21 counts the data output from the latch circuits 20-0 to 20-15. In the example of FIG. 10, as a result of the counting performed by the counter 21, the failure number Nfail becomes "2". The comparison result becomes Nfail=N0 in the comparator 22. Therefore, the control circuit 7 recognizes that the "A"-failure detection passes in verification.

The same holds true for the "B"-failure detection and the "C"-failure detection.

Figure 11:
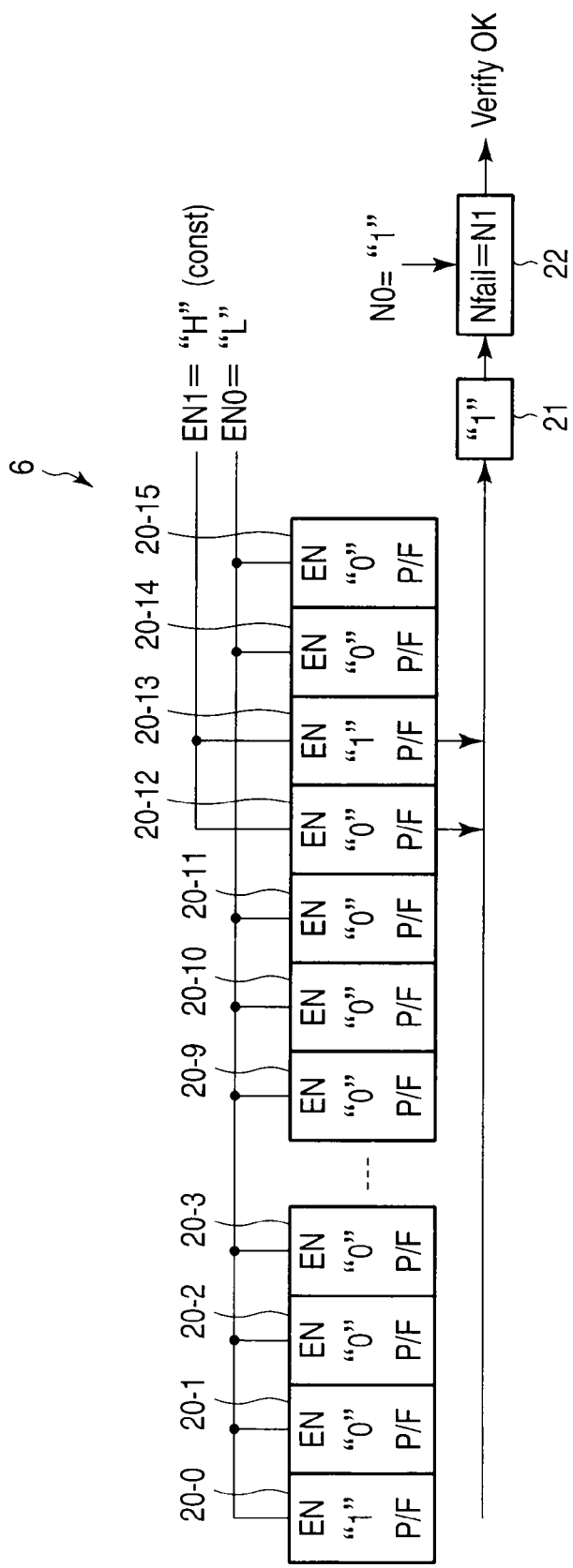

Then the flag-failure detection will be described with reference to FIG. 11. FIG. 11 is a block diagram of the pass/failure circuit 6 during the pass/failure operation. In FIG. 11, by way of example, the reference value is set to "1", and the failure exists in the columns C0 and C13.

The data retained in the latch circuits 20-0 to 20-15 are similar to those of FIG. 10. The case in FIG. 11 differs from the case in FIG. 10 in that, during the flag-failure detection, the signal EN0 is set to the "L" level while the reference value N1 is provided to the comparator 22.

Because the signal EN0 is set to the "L" level, the latch circuits 20-0 to 20-11, 20-14, and 20-15 do not output the data, but only the latch circuits 20-12 and 20-13 output the data to the counter 21.

Therefore, the failure number Nfail becomes "1" in the counter 21. The comparison result becomes Nfail=N1 in the comparator 22. As a result, the control circuit 7 recognizes that the flag-failure detection passes in verification. That is, the data write operation is completed to the "A" level.

<Effect of First Embodiment>

As described above, reliability of data read can be improved in the semiconductor storage device of the first embodiment. The effect of the first embodiment will be described below.

Recently, a design rule of the memory cell transistor becomes finer in the NAND flash memory. Because a write characteristic of the memory cell transistor MT is degraded with the progress of the finer design rule, it is necessary to increase the allowable number of defects during the write operation. Occasionally, even if the allowable number of defects is increased, it is necessary to give a higher priority to the improvement of a write speed. As a result, it is necessary to increase the number of bits of ECC correction data (hereinafter referred to as ECC data), such as parity, which can correct the allowable number of defects and the number of broken memory cell transistors MT.

Even if the allowable number of defects is increased during the write operation, a problem is not posed with respect to the externally input data when the ECC data is sufficiently prepared. However, obviously the increase of the ECC data causes an increase of chip area due to an increased number of columns and the degradation of the operation speed due to the ECC correction.

The information (flag data) indicating how many bits of the data the memory cell transistor MT stores is required for the multi-level NAND flash memory in which the memory cell transistor MT can retain the data with at least two bits. The flag data is used only in the NAND flash memory. For example, the state in which the plural-bit data (i.e. plural-page data, for example both the upper page data and the lower page data) is written into the memory cell transistor MT can be recognized by the flag data of "1", and the state in which the one-bit data (i.e. only one-page data, for example only the lower page data) is written into the memory cell transistor MT can be recognized by the flag data of "0".

The state in which the plural-bit data is written differs from the state in which only one-bit data is written in the data read sequence. For example, the read data is erroneously determined when the data read sequence for the memory cell transistor MT in which the plural-bit data is written is applied to the memory cell transistor MT in which the only one-bit data is written.

Accordingly, the flag data is very important data, and it is necessary that the flag data be able to be corrected. There is a method for providing a redundant bit in order to correct the flag data. In the method, for example, "0" is written in eight bits, and the flag data is determined to be "1" when at least four bits are "0" during the data read.

The following problem is possibly posed in the method. In the NAND flash memory, the determination whether the failure number is equal to or lower than the allowable number of defects is collectively made for all the columns in the program verification operation.

Because the amount of the flag data information is only one bit, even if the flag data and the redundant flag necessary to correct the flag data is determined to be failure, possibly the total failure number may be lower than the allowable number of defects. This is because the allowable number of defects is increased. Therefore, even if the program passes in the verification, the correct flag data cannot be read in the subsequent read operations, which results in the false read. In order to solve the problem, it is considered that the redundant bit for the flag data is increased. However, when the redundant bit for the flag data is increased, possibly the chip area is increased or the operation speed is degraded.

On the other hand, the allowable number of defects (reference value N0) for all the columns including the normal data and the flag data and the allowable number of defects (reference value N1) only for the flag data (and the redundant data of the flag data; hereinafter the redundant data and the flag data are collectively referred to as "flag data" unless otherwise stated) are separately set in the configuration of the first embodiment. The write of the flag data is completed, when not only the failure numbers existing in all the columns becomes the reference value N0 or less but also the failure number included in the flag data becomes the reference value N1 or less.

In order to realize the operation, the signals EN0 and EN1 are input to the latch circuit 20 that retains the pass/failure information. More specifically, the signals EN0 and EN1 are supplied through an interconnection connected to the latch circuit 20, which enables only the latch circuits 20-12 and 20-13 that retain the pass/failure information on the columns C12 and C13 for the flag data to be selected (that is, activated). As a result, the counter 21 can count only the failure numbers existing in the columns C12 and C13 in the flag data region.

A value (smaller failure number) stricter than the reference value N0 is set as the reference value N1 for the flag data. Therefore, the program is repeated until at least the failure number for the flag data satisfies the reference value N1. When the reference value N1 cannot be satisfied by any means, the write operation is failed. Therefore, even if the allowable number of defects is increased, the flag data can correctly be read without increasing the redundant bit for the flag data more than necessary. In other words, the data can correctly be written. Accordingly, the occurrence of the false read can be suppressed to improve the operation reliability of the NAND flash memory.

The pass/failure detection operation including the flag-failure detection can be performed in parallel with the program operation as illustrated in FIG. 6. Accordingly, the flag-failure detection has no influence on the operation speed.

[Second Embodiment]

A semiconductor memory device according to a second embodiment will be described below. In the second embodiment, the latch circuit 20 of the first embodiment can be selected by external input from the host device. Other configurations are similar to those of the first embodiment. Accordingly, only a point different from that of the first embodiment will be described below.

<Configuration>

Figure 12:
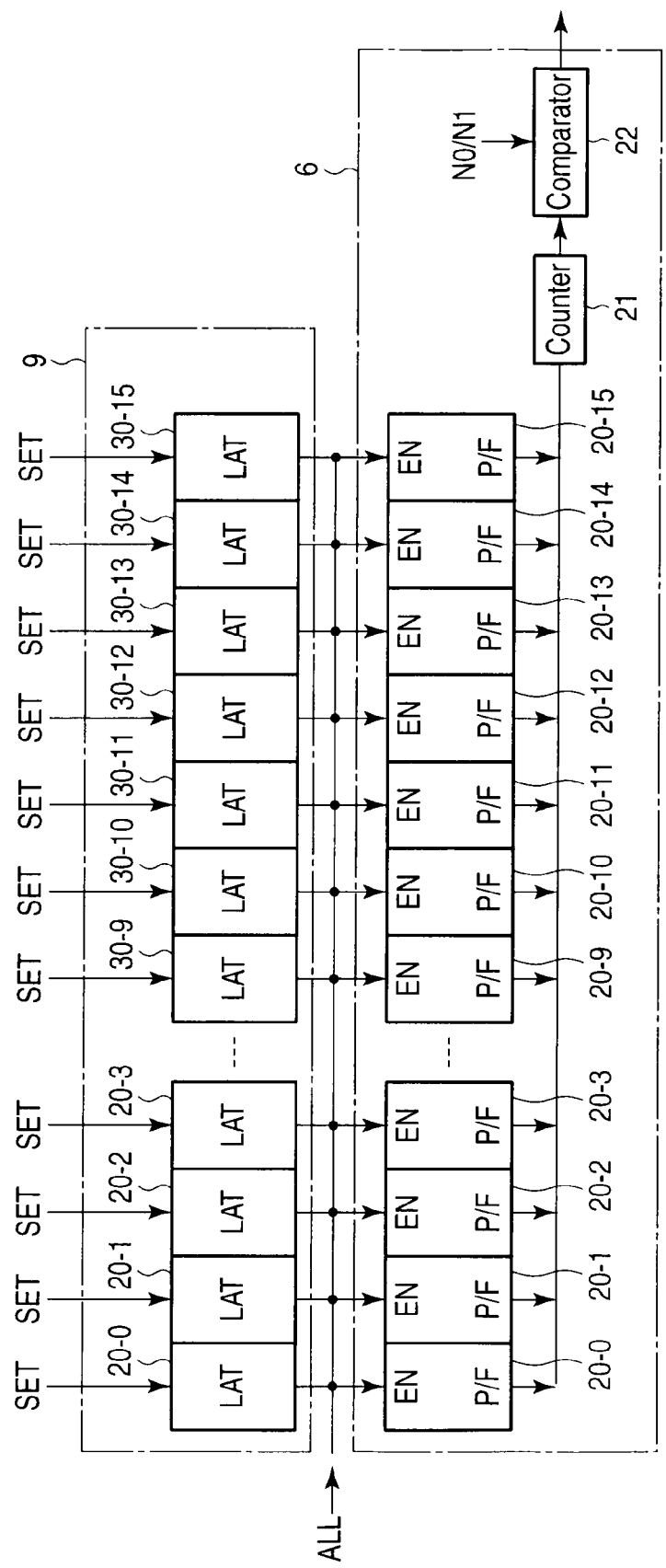
FIG. 12 is a block diagram of a pass/failure circuit and a setting unit according to a second embodiment.

First a configuration of a NAND flash memory 1 of the second embodiment will be described. The NAND flash memory 1 of the second embodiment further includes a setting unit 9 in the configuration of FIGS. 1 to 4 of the first embodiment. FIG. 12 is a block diagram of the pass/failure circuit 6 and the setting unit 9.

As illustrated in FIG. 12, the setting unit 9 includes selection latch circuits 30-0 to 30-15 associated with the latch circuits 20-0 to 20-15, respectively. The selection latch circuits 30-0 to 30-15 receive a signal SET externally input by the host device and retain the data of the "H" level or "L" level according to the signal SET. The selection latch circuits 30-0 to 30-15 produce the enable signal EN according to the retained data and transfers the enable signal EN through the interconnection connected between the selection latch circuits 30-0 to 30-15 and the latch circuits 20-0 to 20-15.

During the pass/failure detection operation, the latch circuits 20-0 to 20-15 of the pass/failure circuit 6 receive the enable signals EN transferred from the selection latch circuits 30-0 to 30-15, respectively. The latch circuit 20 performs the operation similar to that of the first embodiment based on the enable signal EN. That is, in the second embodiment, the enable signal EN (signals EN0 and EN1) provided from the control circuit 7 in the first embodiment is supplied from the selection latch circuit 30. Other configurations are similar to those of the first embodiment. As described above in the first embodiment, the latch circuit 20 can receive the program data from the host device or the control circuit 7, receive the read data and the pass/failure information from the sense amplifier 10, and output the pass/failure information to the counter 21.

<Operation>

Figure 13:
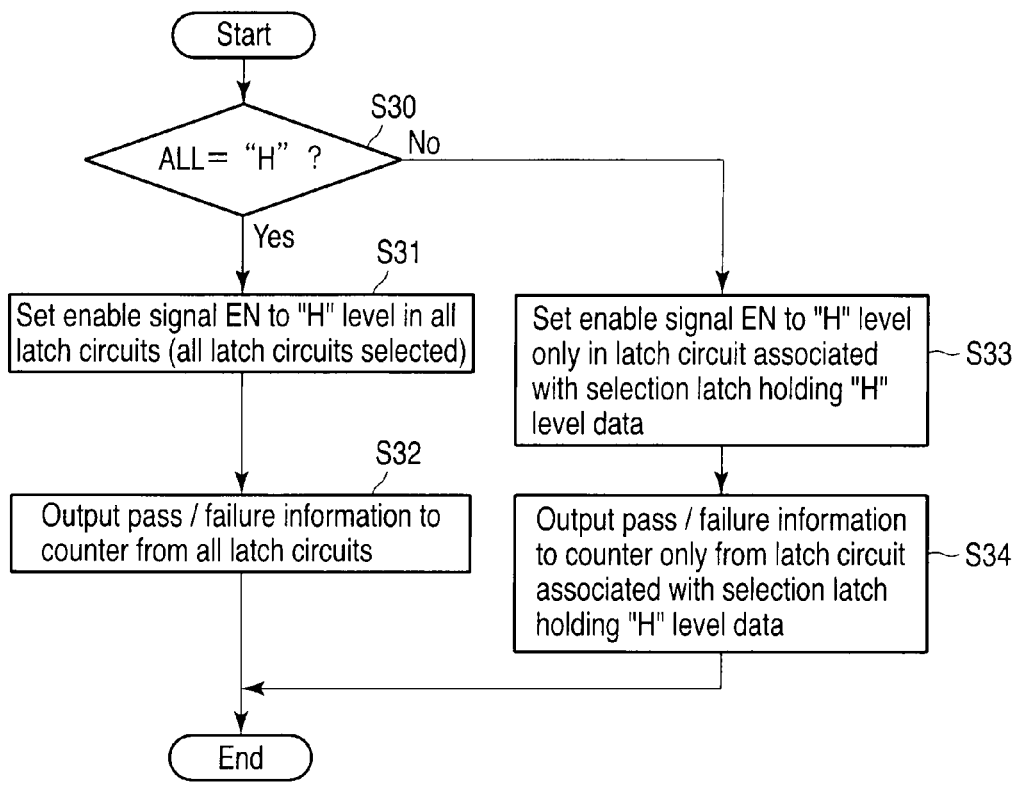
FIG. 13 is a flowchart illustrating an operation of the pass/failure circuit according to the second embodiment.

The operation of the NAND flash memory of the second embodiment will be described below. The operations of the latch circuit 20 and the selection latch circuit 30 during the pass/failure detection operation will be described by way of example. FIG. 13 is a flowchart illustrating a flow of the operations of the latch circuit 20 and the selection latch circuit 30.

As illustrated in FIG. 13, when all the data retained in the selection latch circuits 30 in the setting unit 9 is set to the "H" level (YES in Step S30), the selection latch circuits 30 set the enable signals EN supplied to all the latch circuit 20 in the pass/failure circuit 6 to the "H" level (Step S31). As a result, all the latch circuits 20 are selected. Accordingly, all the latch circuits 20 output the pass/failure information (the failure number as a specific example) to the counter 21.

On the other hand, when one of the selection latch circuits 30 retains the "L" level (NO in STEP S30), only the selection latch circuit 30 that retains the "H" level sets the enable signal EN to the "H" level, and the selection latch circuit 30 that retains the "L" level sets the enable signal EN to the "L" level (Step S33). As a result, only some of the latch circuits 20 are selected. Only the latch circuit 20 whose enable signal EN is set to the "H" level outputs the pass/failure information to the counter 21 (Step S34).

The branch to "YES" in Step S30 corresponds to the "A"-failure detection, "B"-failure detection, and "C"-failure detection, which have been described in the first embodiment. On the other hand, the branch to "NO" corresponds to the flag-failure detection. At this point, the selection latch circuits 30-12 and 30-13 retain the "H" level, and the selection latch circuits 30-0 to 30-11, 30-14, and 30-15 retain the "L" level. Therefore, only the latch circuits 20-12 and 20-13 (see FIG. 4) associated with the columns C12 and C13 that are the flag data region output the failure numbers to the counter 21.

<Effect of Second Embodiment>

The effect similar to that of the first embodiment is obtained in the NAND flash memory of the second embodiment. Additionally, a degree of freedom of the pass/failure detection operation described in the first embodiment can be increased. The effect of the second embodiment will be described below.

The flag data is very important information in the page data as described in the first embodiment. However, in addition to the flag data, there is a demand for writing the data with high accuracy depending on a user. More specifically, ECC data is written with accuracy higher than that of other pieces of data, or several bytes of important data from the head of the page data are written with high accuracy.

The configuration of the second embodiment can deal with such situations. In the second embodiment, the selection latch circuit 30 is provided in each latch circuit 20 that retains the pass/failure information. The enable signal EN is produced according to the information retained in the selection latch circuit 30, and allows only the selected latch circuit 20 to output the pass/failure information to the counter 21. It can be said that the information retained in the selection latch circuit 30 is the information for selecting the latch circuit 20. The selection latch circuit 30 can be set by the signal SET provided from the user (host device). Accordingly, only the failure number for the column, required by the user, can be taken out. The allowable number of defects can be changed in each selected column by changing the reference value (reference values N0 and N1 in the example of FIG. 12) input to the comparator 22 according to the selected latch circuit 20. That is, write accuracy can be changed in each data.

The signal SET input to the latch circuit 30 can be performed in the manner similar to the case where the program data is set in the page buffer 5.

When the pass/failure information is output to the latch circuit 20, the need to input the signal SET to the selection latch circuit 30 may be eliminated. For example, as illustrated in FIG. 12, the control circuit 7 may supply a signal ALL. When the signal ALL is set to the "H" level, all the latch circuits 20 are selected (EN="H") irrespective of contents retained in the selection latch circuit 30. On the other hand, when the signal ALL is set to the "L" level, the latch circuit 20 is selected according to the contents retained in the selection latch circuit 30. That is, in FIG. 12, a cross-point of a signal line through which the signal ALL is transferred and a signal line connecting the latch circuit 30 and the latch circuit 20 acts as an OR circuit. The result of OR operation of the signal ALL and the contents retained in the latch circuit 30 may become the signal EN.

[Third Embodiment]

A semiconductor memory device according to a third embodiment will be described below. In the third embodiment, the enable signal EN of the first embodiment is used not only in reading the pass/failure information from the latch circuit 20 but also in storing the program data in the latch circuit 20. Only a point different from that of the first embodiment will be described below.

<Configuration>

Figure 14:
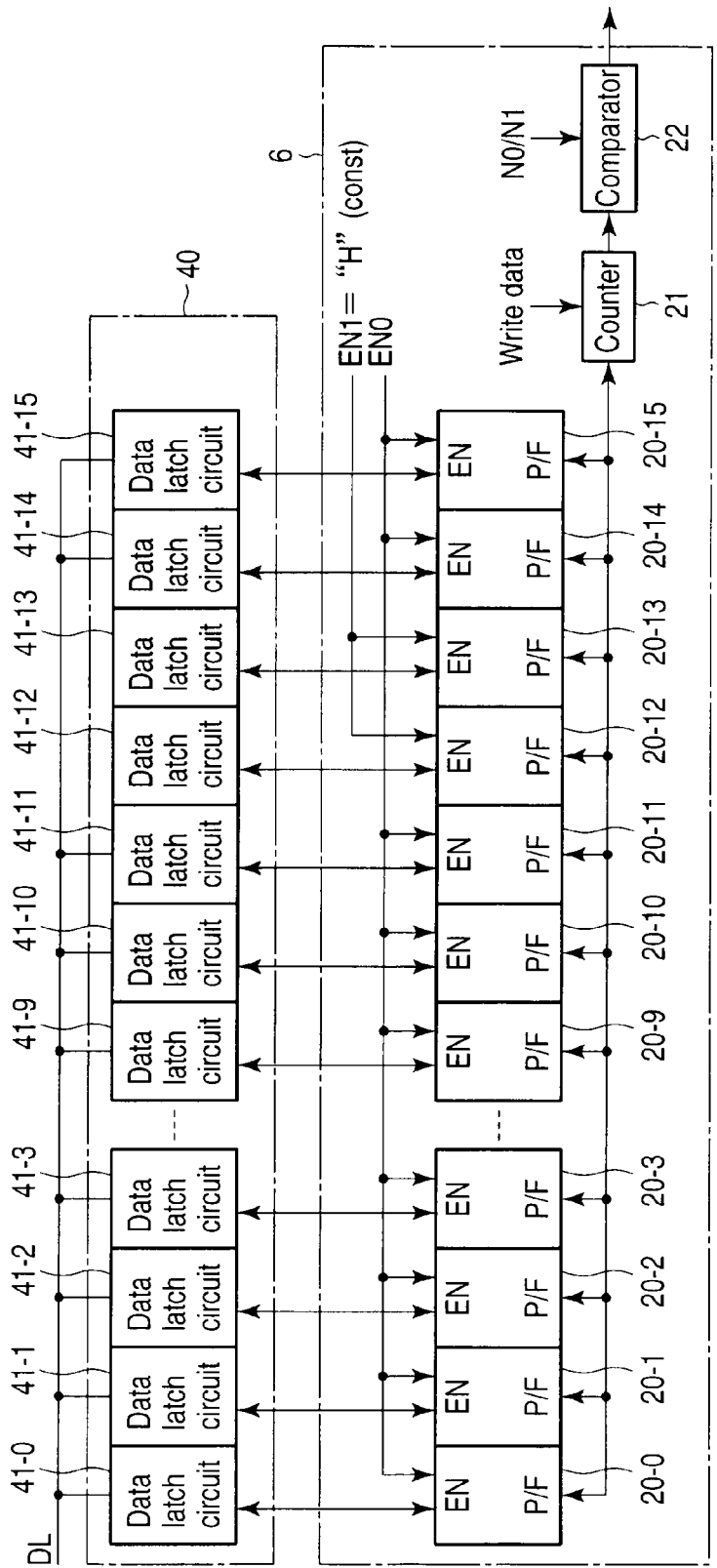
FIG. 14 is a block diagram of a pass/failure circuit and a data buffer according to a third embodiment.

First a configuration of a NAND flash memory 1 of the third embodiment will be described. The NAND flash memory 1 of the third embodiment further includes a data buffer 40 in the configuration of FIGS. 1 to 4 of the first embodiment. FIG. 14 is a block diagram of a pass/failure circuit 6 and the data buffer 40.

As illustrated in FIG. 14, the data buffer 40 includes data latch circuits 41-0 to 41-15 that are associated with the latch circuits 20-0 to 20-15, respectively. During the data write, the data latch circuits 41 except the data latch circuits 41-12 and 41-13 temporarily retain the program data input through the data line DL from the host device. On the other hand, during the data read, the data latch circuits 41 except the data latch circuits 41-12 and 41-13 temporarily retain the read data transferred from the latch circuit 20 and outputs the read data to the host device through the data line DL.

That is, the data buffer 40 except the data latch circuits 41-0 to 41-15 associated with the flag data region functions as a temporal buffer for the data input and output from and to the host device. Hereinafter the data latch circuits 41-0 to 41-15 are simply referred to as data latch 41 when not distinguished from one another.

During the data write, in addition to the function described in the first embodiment, the counter 21 of the pass/failure circuit 6 receives the program data (for example, the flag data produced by the control circuit 7) produced in the NAND flash memory 1 and temporarily retains the program data. The counter 21 can transfer the received data to the latch circuit 20.

During the data write, in addition to the function described in the first embodiment, the latch circuit 20 receives the program data from the data latch circuit 41 or the counter 21 and temporarily retains the program data. Then the latch circuit 20 can transfer the program data to the page buffer 5. At this point, the latch circuit 20 can capture and retain the data by setting the enable signal EN to the "H" level.

<Operation>

Figure 15:
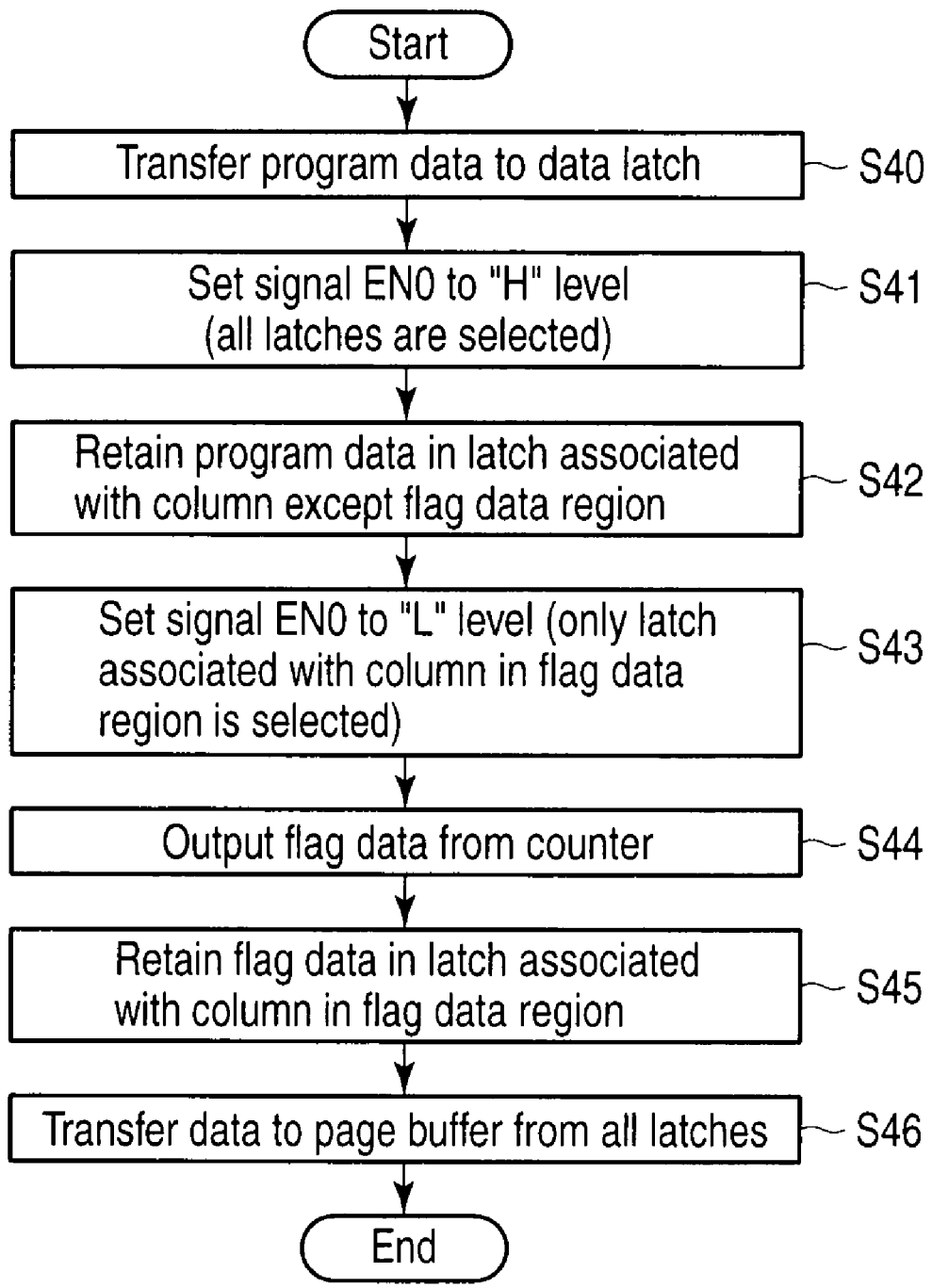
FIG. 15 is a flowchart illustrating operations of the pass/failure circuit and the data buffer according to the third embodiment.

The operation of the NAND flash memory of the third embodiment will be described below. The operations of the pass/failure circuit 6 and the data buffer 40 in transferring the program data to the page buffer 5 will be described by way of example. The operation during the pass/failure detection operation is similar to that of the first embodiment. FIG. 15 is a flowchart illustrating a flow of the operations of the pass/failure circuit 6 and the data buffer 40.

As illustrated in FIG. 15, the program data (including the ECC data) input from the host device is transferred to the data latch circuits 41-0 to 41-11, 41-14, and 41-15 of the data buffer 40 through the data line DL (Step S40). Then the control circuit 7 sets the signal EN0 to the "H" level (Step S41). Because the signal EN1 is always set to "H" level, the enable signal EN is set to the "H" level in all the latch circuits 20. That is, all the latch circuits 20 are selected. Accordingly, the latch circuits 20-0 to 20-15 capture and retain the data retained in the data latch circuits 41-0 to 41-15 (Step S42). At this point, because the data are not transferred from the host device to the data latch circuits 41-12 and 41-13, the program data are retained only in the latch circuits 20-0 to 20-11, 20-14, and 20-15. FIG. 16 illustrates this state. As illustrated in FIG. 16, the program data are transferred from the data latch circuits 41-0 to 41-11, 41-14, and 41-15 to the latch circuits 20-0 to 20-11, 20-14, and 20-15.

Then the control circuit 7 sets the signal EN0 to the "L" level (Step S43). As a result, only the latch circuits 20-12 and 20-13 for the columns C12 and C13 associated with the flag data region are selected. The control circuit 7 inputs the flag data to the counter 21, and the counter 21 outputs the flag data to the latch circuit 20 (Step S44). Although the time the control circuit 7 causes the counter 21 to retain the flag data may be in any one of Steps S40 to S44, the time the counter 21 outputs the flag data is at the same time as or after the time the signal EN0 is set to the "L" level.

Figure 17:
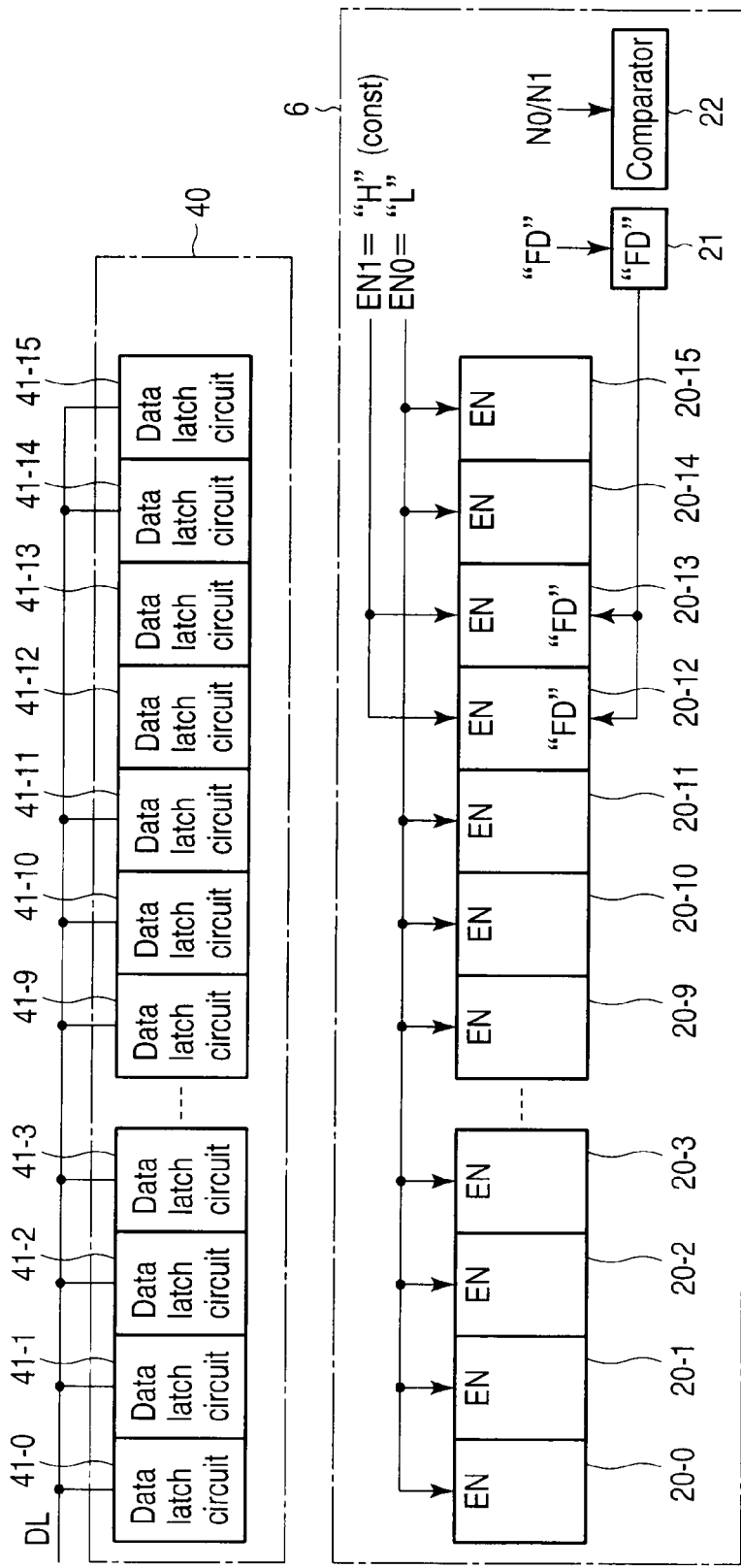

Only the selected latch circuits 20-12 and 20-13 capture and retain the flag data provided from the counter 21. FIG. 17 illustrates this state. As illustrated in FIG. 17, the flag data FD are captured in the latch circuits 20-12 and 20-13.

Thus, the necessary program data are stored in all the latch circuits 20-0 to 20-15. The latch circuits 20-0 to 20-15 transfer the retained program data to the page buffer 5 in units of one page (Step S46). As a result, the transfer of the program data to the page buffer 5 is completed.

<Effect of Third Embodiment>

The effect similar to that of the first embodiment is obtained in the NAND flash memory of the third embodiment. Additionally, the data can be written at high speed. The effect of the third embodiment will be described below.

The latch circuit 20 in the pass/failure circuit 6 not only retains the pass/failure information during the pass/failure detection operation, but also is used to retain the program data provided through the data line DL (input/output line, I/O line). For example, the latch circuit 20 stores the pass/failure information during the program operation, and stores the data to be programmed before the program operation. At this point, the program data is transferred to the latch circuit 20 through the data buffer 40. At the time the program data is transferred from the data buffer 40 to the latch circuit 20, the data buffer 40 becomes empty to be able to accept the next data. That is, the data buffer 40 can accept the next data at a stage at which the program is not completed. This is well known as a cache operation.

The following problem is possibly posed when the flag data is also input through the data line DL and the data buffer 40 similarly to other program data. In order to input the program data to the NAND flash memory 1, the program data (including the ECC data) provided from the host device is input to the data buffer 40 through the data line DL, and then transferred to the latch circuit 20 of the pass/failure circuit 6. Then the flag data is input again to the data buffer 40 through the data line DL, and then transferred to the latch circuit 20 of the pass/failure circuit 6. Thus, the data input to the latch circuit 20 of the pass/failure circuit 6 is performed at two stages. When the program data is merely transferred from the host device to the pass/failure circuit 6, the NAND flash memory 1 is still in the busy state (the state in which the data cannot be accepted). The NAND flash memory 1 cannot become the ready state (the state in which the data can be accepted) unless the transfer of the flag data is completed. Accordingly, it takes a long time to input the data.

On the other hand, in the configuration of the third embodiment, the flag data is input from the counter 21 to the latch circuits 20-12 and 20-13 without use of the data line DL. Therefore, the NAND flash memory 1 can become the ready state at the time the transfer of the external program data to the pass/failure circuit 6 is completed. Accordingly, the data can be input at high speed to enhance the operation speed of the NAND flash memory.

As described above, according to the first to third embodiments, the NAND flash memory 1 includes the plurality of memory cells MT each of which is associated with the row and the columns C0 to C15, and configured to store data; and the plurality of latch circuits 20 each of which is provided while associated with each of the columns C0 to C15, and configured to store the write data and/or read data for the associated column, wherein the latch circuit 20 is selectively activated, and the activated latch circuit 20 can receive (or capture) or output the data.

In the first and second embodiments, the NAND flash memory 1 further includes the comparator 22 which performs a comparison operation based on the first threshold N0 and the second threshold N1 different from the first threshold N0. The column includes the first columns C0 to C11, C14, and C15 and the second columns C12 and C13. The latch circuit 20 includes the first latch circuits 20-0 to 20-11, 20-14, and 20-15 associated with the first columns C0 to C11, C14, and C15 and the second latch circuits 20-12 and 20-13 associated with the second columns C12 and C13. The comparator 22 performs the comparison operation based on the first threshold N0 when the first latch circuits 20-0 to 20-11, 20-14, and 20-15 are activated, and performs the comparison operation based on the second threshold N1 when the second latch circuits 20-12 and 20-13 are activated while the first latch circuits 20-0 to 20-11, 20-14, and 20-15 are inactivated.

In the first and second embodiments, the second columns C12 and C13 store the flag data indicating the amount of information stored in the memory cell MT, and the first columns C0 to C11, C14, and C15 store the data other than the flag data. During data write, the latch circuit 20 stores the result of program verification for the associated columns C0 to C15, and the comparator 22 compares the failure number Nfail of the program verification output from the activated latch circuits 20-0 to 20-15 with the first and second thresholds N0 and N1.

In the above-described configurations, the pass/failure of the verification can be determined with different thresholds with respect to the plurality of data blocks included in the same page. For example, when the flag data are retained in the second columns C12 and C13, the threshold used in the pass/failure determination for the flag data can be set stricter than that of other data. It is not necessary to increase the number of redundancy columns in order to obtain the effect. The write reliability in the NAND flash memory 1 can be improved without enlarging the area, and therefore the occurrence of the false read can be suppressed.

In the third embodiment, the NAND flash memory 1 further includes first data storing units 40-0 to 40-11, 40-14, and 40-15 which temporarily store the externally input first write data; and a second data storing unit 21 which temporarily store the internally produced second write data, wherein the activated latch circuits 20-0 to 20-15 latch one of the first write data and the second write data.

According to the configuration of the third embodiment, the second write data can be input to the latch circuit 20 without use of the I/O line (data line DL) through which the data is transmitted and received to and from the host device that controls the NAND flash memory 1. Accordingly, an occupation frequency of the I/O line can be reduced, particularly the operation speed of the NAND flash memory 1 can be enhanced during the cache operation.

In the first to third embodiments, the case where the flag data is written in the memory cell transistor MT using the "A" level has been described by way of example. Alternatively, the flag data may be written in the memory cell transistor MT using the "B" level or the "C" level. For example, when the "B" level is used, the flag-failure detection may be performed with the voltage VB as the read level after the "B"-failure detection is performed in FIG. 6. At this point, when the failure number becomes the allowable number of defects or less in both the "B"-failure detection and the flag-failure detection, the "B"-verification is omitted after that. When the "C" level is used, the flag-failure detection may be performed with the voltage VC as the read level after the "C"-failure detection is performed in FIG. 6. At this point, when the failure number becomes the allowable number of defects or less in both the "C"-failure detection and the flag-failure detection, the data write operation is completed. The memory cell transistor MT may retain not only the 2 bits (4 levels) but also 3 bits (8 levels) or 4 bits (16 levels). The same holds true for the flag data.

In the first embodiment, the case where the columns C12 and C13 associated with the latch circuits 20-12 and 20-13 retain the flag data has been described by way of example. However, the data is not limited to the flag data as long as the data that is important in the page has a restriction on the maximum number of allowable detects. For example, the data may be the ECC data. The same holds true for the second and third embodiments. For example, in the third embodiment, the data input from the counter 21 is not limited to the flag data, but there is no restriction on the data as long as the data is produced in the NAND flash memory 1.

In the first and second embodiments, the page data is divided into the flag data and other pieces of data, and the reference values in the comparator 22 are set to the flag data and other pieces of data, respectively. However, the page data may be divided into at least three kinds of data, and the reference values may set to the three kinds of data, respectively. Some reference values may be equal to each other. In such cases, for example, another signal may be used as the enable signal EN in addition to the signals EN0 and EN1.

In the second embodiment, for example, an AND operation of the data stored in the selection latch circuit 30 and the data in the latch circuit 20 may be performed. In such cases, as a result of the AND operation, the failure number remains only in the latch circuits 20-12 and 20-13 for the flag, and the data becomes "0" in the latch circuits 20-0 to 20-11, 20-14, and 20-15. Accordingly, the counter 21 can count only the failure number in the column for the flag when all the latch circuits 20 output the data to the counter 21. Even in the method, the latch circuit 20 can selectively be activated.

The first to third embodiments can be applied even if the flag data is replaced with the redundancy column. In such cases, the flag-failure detection is performed to the redundancy column, and the flag data is transferred from the counter 21 to the latch circuit 20 associated with the redundancy column.

In the first and second embodiments, the operations during the program verification have been described by way of example. However, the first and second embodiments can be applied during the erasing verification performed during the erasing operation.

The third embodiment can be applied to the second embodiment. That is, in the configuration of FIG. 14 of the third embodiment, the enable signals EN of the latch circuits 20-0 to 20-15 may be controlled by the latch circuits 30-0 to 30-15 and/or the signal ALL. The plurality of pieces of data may be transferred from the counter 21 to the latch circuits 20. For example, the following method may be used. That is, after the data is transferred from the data buffer 40, the first latch circuit 20 is selected by the latch circuit 30, the first data is transferred from the counter 21 to the first latch circuit 20, the second latch circuit 20 is selected by the latch circuit 30, and the second data is transferred from the counter 21 to the second latch circuit 20.

The third embodiment can independently be performed without conditions of the first and second embodiments. That is, the pass/failure circuit 6 performs the operation similar to that of the conventional technique during the pass/failure detection operation, and the latch circuit 20 may be operated based on the enable signal EN only when the data is transferred to the latch circuit 20.

Although the NAND flash memory has been described in the first to third embodiments by way of example, the semiconductor storage device of the embodiments may be applied to a NOR flash memory, a DINOR flash memory, and an AND flash memory. The semiconductor storage device of the embodiments can be applied not only to the flash memories but also to a general semiconductor memory such as an Magneto-resistive Random Access Memory (MRAM) in which a magneto tunneling junction element is used as the memory cell and a Resistance Random Access Memory (ReRAM) in which a variable resistive element is used. Particularly, when the flag data is used, the semiconductor storage device of the embodiments can be applied to a general semiconductor memory in which one memory cell can retain the data having at least two bits.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory cells associated with columns and capable of storing data;
a plurality of latch circuits associated with the columns and capable of storing write data and/or read data for the columns; and
a comparator which performs a comparison operation based on a first threshold and a second threshold different from the first threshold,
wherein the latch circuits are selectively activated, and activated latch circuits are capable of receiving and/or outputting data,
the columns include a first column and a second column,
the latch circuits include a first latch circuit associated with the first column and a second latch circuit associated with the second column, and
the comparator performs the comparison operation based on the first threshold when the first latch circuit is activated, and performs the comparison operation based on the second threshold when the second latch circuit is activated while the first latch circuit is inactivated.

2. The device according to claim 1, wherein the second column stores flag data indicating an amount of information stored in the memory cells, the first column stores data other than the flag data,
during data write, each of the latch circuits stores a result of program verification for the associated one of the columns, and
the comparator compares a failure number of the program verification output from the activated latch circuits with the first and second thresholds.

3. The device according to claim 2, wherein a program operation is repeated during the data write, until the failure number of the program verification for the first column becomes the first threshold or less and the failure number of the program verification for the second column becomes the second threshold or less.

4. The device according to claim 3, wherein a determining whether the failure number for Nth (N: integer number) program operation is less than the first or second threshold or not is executed in parallel with (N+1)th program operation.

5. The device according to claim 1, further comprising:
a first interconnection connected to the first latch circuit to transmit a first signal which activates the first latch circuit; and
a second interconnection connected to the second latch circuit to transmit a second signal which activates the second latch circuit,
wherein the second latch circuit is always activated by the second signal.

6. The device according to claim 1, further comprising:
a third latch circuit which is associated with the first latch circuit and activates the first latch circuit according to stored data; and
a fourth latch circuit which is associated with the second latch circuit and activates the second latch circuit according to stored data.

7. The device according to claim 1, further comprising:
a first data storing unit which temporarily stores externally input first write data; and
a second data storing unit which temporarily stores internally produced second write data,
wherein the activated latch circuits latch one of the first write data and the second write data.

8. The device according to claim 7, wherein a signal path in transferring the first write data to the first data storing unit differs from a signal path in transferring the second write data to the second data storing unit.

9. The device according to claim 8, wherein, after the first write data is transferred to the latch circuits, the first data storing unit is capable of receiving the next first write data even while performing a program to the memory cells.

10. The device according to claim 1, wherein the comparator performs the comparison operation based on the first threshold and the comparison operation based on the second threshold in parallel with a data program operation.

11. A method for controlling a semiconductor memory device, comprising:
reading first information and second information from a first column and a second column to a first latch circuit and a second latch circuit, respectively;
activating the first latch circuit and the second latch circuit to read the first information and the second information to a comparator;
performing a comparison operation to the first information and the second information based on a first threshold with the comparator, after the first information and the second information are read to the comparator;
activating the second latch circuit while inactivating the first latch circuit to read the second information to the comparator; and
performing the comparison operation to the second information based on a second threshold with the comparator, after the second information is read to the comparator while the first latch circuit is inactivated.

12. The method according to claim 11, wherein the first column and the second column include a first memory cell and a second memory cell, respectively, and
the second memory cell stores a flag data indicating an amount of information stored in the first memory cell.

13. The method according to claim 12, wherein the first information and the second information are program verification results for the first column and the second column.

14. The method according to claim 13, wherein the first information and the second information indicate whether failure exists in the first column and the second column, respectively.

15. The method according to claim 14, wherein a program operation is repeated, until failure numbers in the first column and the second column become the first threshold or less and the failure number in the second column becomes the second threshold or less.

16. The method according to claim 15, wherein a determining whether the failure number for Nth (N: integer number) program operation is less than the first or second threshold or not is executed in parallel with (N+1)th program operation.

17. The method according to claim 11, further comprising receiving a signal for selecting the first latch circuit and/or the second latch circuit, and storing the signal in a third latch circuit, wherein, in reading the second information to the comparator, the first latch circuit is inactivated while the second latch circuit is activated based on the signal stored in the third latch circuit.

18. The method according to claim 11, further comprising:
receiving externally first write data and storing the first write data in a first data storing unit;
activating the first latch circuit to transfer the first write data from the first data storing unit to the first latch circuit;
storing internally produced second write data in a second data storing unit;
activating the second latch circuit while inactivating the first latch circuit, and transferring the second write data to the second latch circuit; and
programming the first write data and the second write data in the first latch circuit and the second latch circuit to the first column and the second column, respectively.

19. The method according to claim 18, wherein a signal path in transferring the first write data to the first data storing unit differs from a signal path in transferring the second write data to the second data storing unit.

20. The method according to claim 11, wherein the comparison operation based on the first threshold and the comparison operation based on the second threshold are performed in parallel with a data program operation.

* * * * *